United States Patent
Haroosh

(12)
(10) Patent No.: US 6,701,472 B2
(45) Date of Patent: Mar. 2, 2004

(54) METHODS FOR TRACING FAULTS IN MEMORY COMPONENTS

(75) Inventor: Nava Haroosh, Kfar Yona (IL)

(73) Assignee: ADC Telecommunications Israel, Ltd., Hertzlia (IL)

(*) Notice: Subject to any disclaimer, the term of this patent is extended or adjusted under 35 U.S.C. 154(b) by 470 days.

(21) Appl. No.: 09/780,127

(22) Filed: Feb. 9, 2001

(65) Prior Publication Data

US 2002/0162061 A1 Oct. 31, 2002

(51) Int. Cl.⁷ .............................................. G11C 29/00
(52) U.S. Cl. ..................................................... 714/720
(58) Field of Search .......................... 714/720, 718–723

(56) References Cited

U.S. PATENT DOCUMENTS

| | | | | |
|---|---|---|---|---|
| 4,061,908 A | * | 12/1977 | DE Jonge et al. | 714/720 |
| 4,559,626 A | * | 12/1985 | Brown | 714/719 |
| 4,782,487 A | * | 11/1988 | Smelser | 714/723 |
| 4,958,345 A | * | 9/1990 | Fujisaki | 714/720 |
| 5,375,091 A | | 12/1994 | Berry, Jr. et al. | |
| 5,633,877 A | * | 5/1997 | Shephard et al. | 714/725 |
| 5,881,221 A | * | 3/1999 | Hoang et al. | 714/42 |

FOREIGN PATENT DOCUMENTS

| | | |
|---|---|---|
| DE | 40 01 563 A | 7/1991 |
| EP | 0 291 283 A | 11/1988 |

* cited by examiner

*Primary Examiner*—Albert Decady
*Assistant Examiner*—Cynthia Britt
(74) *Attorney, Agent, or Firm*—Fogg and Associates, LLC; David N. Fogg; Scott V. Lundberg

(57) ABSTRACT

There are disclosed methods and apparatus for testing memory components for faults, defects or the like, by generating a testing sequence that produces various bit combinations as well as current changes, that when coupled, stresses or fatigues the memory component, and allows for the evaluation of single bits. The testing sequence is provided in cycles, formed of complement word pairs of N bit words. The first, or initial, cycle typically includes a first word of all binary zeros. Successive or subsequent cycles include a shifted bit in each subsequent first word. The testing pattern is written into the memory component(s) under test and corresponding words are read from the memory component(s). The written and read words are then compared, with this comparison analyzed for detection of faults, defects or the like in the memory component(s).

28 Claims, 4 Drawing Sheets

```
HEX         40    BIN                                20
00000000          00000000000000000000000000000000
FFFFFFFF          11111111111111111111111111111111      30

00000001          0000000000000000000000000000000①
FFFFFFFE          11111111111111111111111111111110

00000002          00000000000000000000000000000010
FFFFFFFD          11111111111111111111111111111101

00000004          00000000000000000000000000000100
FFFFFFFB          11111111111111111111111111111011

*
    *
    *            32
80000000         ①0000000000000000000000000000000
7FFFFFFF          01111111111111111111111111111111
```

FIG. 2

METHODS FOR TRACING FAULTS IN MEMORY COMPONENTS

TECHNICAL FIELD

The present invention is relates to the field of memory devices, and in particular, to methods for tracing faults in memory components.

BACKGROUND

Memory components, for example, FIFO (first in first out) and SDRAM components, prior to their release are typically tested, so as not to be released with faults. Contemporary testing methods for tracing problems in memory components on a circuit, typically a chip on a board, are usually conducted with procedures that test based on the overall current in a line, or the overall current in each individual bit.

Typical testing procedures where overall current in a line is analyzed involve processes where an all "zeros" word is written and read and followed by an "ones" word that is written and read, with this alternating pattern continuing as necessary. If expressed in Hexadecimal (base 16 also known as hex), a typical testing pattern is as follows:

0x00000000
0xFFFFFFFF
0x00000000
0xFFFFFFFF
.
.
.
0x00000000
0xFFFFFFFF

This method exhibits drawbacks, as after a few lines, the memory component under test does not respond to current changes. This may be due to a situation, where a bit of one value is surrounded by bits of other values, with the difference between these values great, whereby the greater value bits effect the lesser value bit to behave similarly with respect to current changes. Accordingly, the memory component simply stops responding to the current changes. This method fails to cause a memory fault, as it fails to stress or fatigue the memory component. Therefore, it will not be known if any actual bits are defective, for the memory component failed to respond to the current change.

Alternately, methods have been developed to look at the overall current in each individual bit. Some exemplary methods that look at the overall current in these bits are commonly known as the "Chessboard", "running one" or "running zero" methods. These methods typically involve sequences as follows (in binary):

0000000000000000
1000000000000000
0100000000000000
0010000000000000
.
.
.
0000000000000001

This method also exhibits drawbacks, in that since the current remains the same from the second line to the end of the sequence, extreme current changes will not be produced in the memory component. As a result, there is a likelihood that defective bits will be missed and thus, not detected.

In a testing method known as random, single words are written and read into memory components. These words need only differ by one bit. There are not any rules or order to the words, as the objective is merely to write and read as many possible word combinations into the memory component as possible. This process exhibits drawbacks as it fails to fatigue the memory components, as current may or may not have changed and can not detect specific defective bits.

One other conventional approach is a ramp method, performed by increasing by "1" as follows:

00000000
00000001
00000010
00000011
00000100
00000101
00000110
00000111
*
*
*
11111111

This ramp method exhibits drawbacks in that only defective words and not specific defective bits can be determined. This is again because this testing sequence simply does not fatigue the memory component sufficiently, as the current is not changed drastically upon incrementing by "1".

SUMMARY

The present invention improves on conventional simulators, by providing a testing method that can detect and allow for tracing of faults in memory components by looking at overall current in the bits, as well as looking at the influence of current in all of the individual bits with respect to other similar bits in the memory component being tested. Embodiments are directed to methods for tracing faults in memory components and in particular, to methods having words, formed of bits, that are composed of all "zeros" or all "ones" except for one bit of the respective word, designated as a "unique" bit, that is moved or shifted in each subsequent word.

Each word, with the unique bit that has been shifted, also known as the shifted bit, and its complement word (or complement), defining a cycle (also known as a compliment pair), are grouped with other cycles in blocks to define a testing sequence or pattern, and written into a memory component. By writing each word with its complement word, followed by words having the shifted bit, and their respective complements, extreme current changes, from each of the complement pairs, occur contemporaneous with changed conditions for individual bits, from the shifting. The shifting in the presence of these extreme current changes creates different bit combinations, where one bit is different from all of the other bits of the combination and each combination itself is different by one bit. The current change coupled with these changed bit combinations stresses or fatigues the memory component, and allows for the evaluation of single bits.

The written words are then read from the memory component being evaluated, and compared with the written words to detect differences. If a difference in corresponding words is detected, an error message is generated and sent, indicative of a fault in the memory component under test.

As a result of these methods, defective individual bits can be specifically identified. This method is easily implemented on conventional computers and other testing equipment. It is economical, as it does not require any special instruments or accessories. Additionally, this method is quick and reliable for determining faults in memory components.

Embodiments of the present invention are directed to methods, systems and computer-usable storage media for testing memory components, that include providing a testing sequence comprising at least a first cycle and at least one subsequent cycle, typically N subsequent cycles. Each cycle includes a first word of N bits and a second word of N bits, with the second word defined as the complement of said first word. Subsequent cycles, after the initial first cycle, typically include a first word having at least one bit shifted with respect to the corresponding bit in the first word of the previous cycle, with the shifted bit being shifted in the direction from least significant bit to most significant bit. The testing sequence is then written into a memory component or components and then read from the memory component or components. The written words then read and compared with the written words, typically for a correspondence therebetween, to allow for analysis of bits, including detection of defective bits, and thus, faults, in the tested memory component or component. This may be through an error message or the like and sent to the computer or the like of the testing party.

BRIEF DESCRIPTION OF THE DRAWINGS

Attention is now directed to the attached drawings, wherein like reference numerals or characters indicate corresponding or like components. In the drawings:

FIG. 1 is a diagram of an embodiment of a testing sequence of the invention;

FIG. 2 is a diagram of the embodiment of FIG. 1 with a corresponding Hex block;

DETAILED DESCRIPTION

Figure 3A:
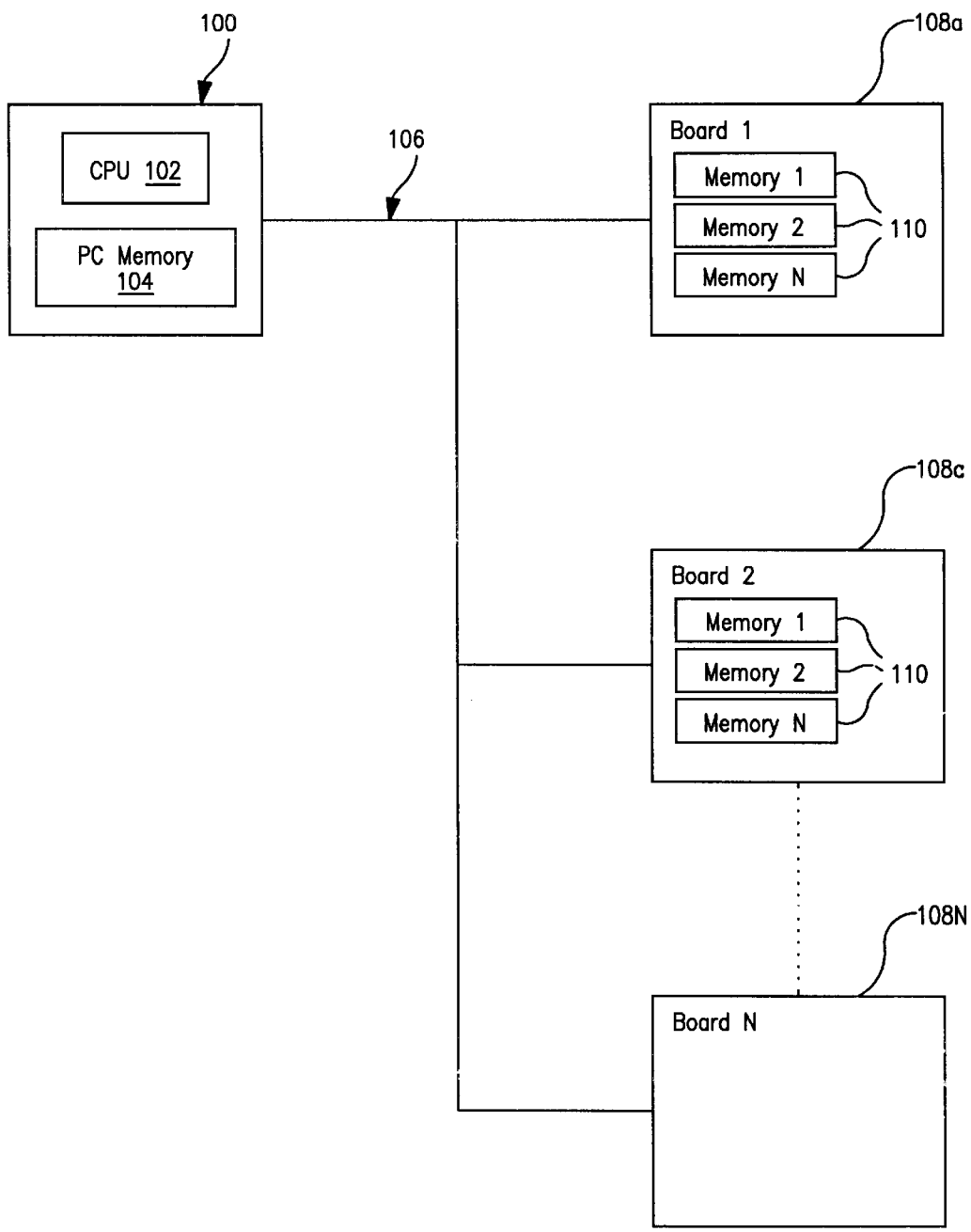
FIGS. 3A and 3B detail an exemplary test set-up for employing embodiments of the present invention.

The testing method, including testing sequences, in accordance with the present invention, will be described for testing memory components on-board. However, this process is exemplary only, and testing in accordance with the present invention is not limited to on-board testing.

Turning to FIG. 1, there is shown block 20 of binary information necessary to perform a testing sequence in accordance with an embodiment of the present invention. A typical block is formed of multiple pairs of words. The word pairs, known as cycles or complement pairs, are formed of a first word and its complement. Each word is formed of bits, typically N bits in length.

While at least two (at least three if an all zeros word is the first word) complement pairs of words is necessary to define a block 20, a typical block includes words, each word of N bits, with N+1 cycles or complement word pairs. It is this block 20 that will be read into the memory component under test, in accordance with the various reading and writing methods detailed below. The block is shown arranged in cycles C1–C(N+1), these cycles corresponding to the complement pairs of words. The first, or initial, cycle C1 has a first word of "all zeros", and thus, its compliment is "all ones". In the second cycle C2, the first subsequent cycle, a bit in the first word has been designated to be shifted or changed from "0" to "1". This designated bit 30 is also known as the "unique bit", with the initial "unique" bit typically designated as the least significant bit of the first word in cycle following the all "zeros" word, here, the first word of the second cycle C2. The compliment of this word is the other word of this second cycle C2. Once the unique bit is shifted, for example in the first word of cycle C3, it is also known as the shifted bit 30'.

Shifting continues in the next subsequent cycles C3–CN with the unique bit, now the shifted bit 30', in each subsequent first word being shifted over by one bit in the direction from least significant bit to most significant bit. Each respective cycle is completed by the complement of the respective first word. The block 20 is complete, when the most significant bit 30" in the first word of a cycle has been shifted, and the complement of this first word is created to complete this last or terminal cycle C(N+1).

By arranging each block in cycles or complement word pairs, with subsequent cycle first words having a shifted "unique" bit, upon writing the desired plurality of cycles into the memory component under test, and then reading these cycles, a multitude of bit configurations can be evaluated for faults in single bits. Specifically, by writing complement word pairs into the memory component under test, the bits of this component are subjected to extreme sudden current changes, to a point where they are stressed. This is coupled with contemporaneously reading cycles (or complement pairs) with shifted unique bits (as with all cycles except the first cycle C1), a non-repetitive check on individual bits in various combinations, is performed. Accordingly, testing sequences employing this block 20 allow individual bits to be evaluated for faults. Specifically, writing each word with its compliment produces extreme current changes. Contemporaneously therewith, the bits are being shifted in respective first words. The shifting in the presence of these extreme current changes, creates different bit combinations, where one bit is different from all of the other bits of the combination and each combination itself is different by one bit. The current change coupled with these changed bit combinations stresses or fatigues the memory component, and allows for the evaluation of single bits.

This binary block 20 is typically sent to the memory component so it can be tested from a computer or the like. Typical computers operate in hex, and convert into binary. Accordingly, FIG. 2 shows the hex code defining a block that will produce the binary block 20, of FIG. 1.

This hex block 40 is such that one hex bit corresponds to four binary (Bin) bits. Each first hex word is paired with its complement. To get "shifting" of the unique bits 30, 30', 30", or the shifted bits, in the corresponding binary first words of the cycles or complement pairs in the binary block 20, the least significant bit of each hex word is incremented by $2^n$, where n is an integer from 0 to 4. Subsequent increments in this hex block 40 involve moving the incremented bit over one bit, in the direction of least significant bit to most significant bit and incrementing this bit as previously described. In the binary (BIN) block 20, equivalent to the hex block 40, the corresponding first word of a previous cycle is multiplied by 2, to arrive at the first word of the subsequent cycle.

The hex block 40 is complete when the most significant bit of the final first word is "8" followed by the requisite number of zeros. The equivalent to binary block 20 is complete when the most significant bit of the first word of the last binary (bin) complement pair or cycle is "1", followed by all zeros.

Figure 3B:
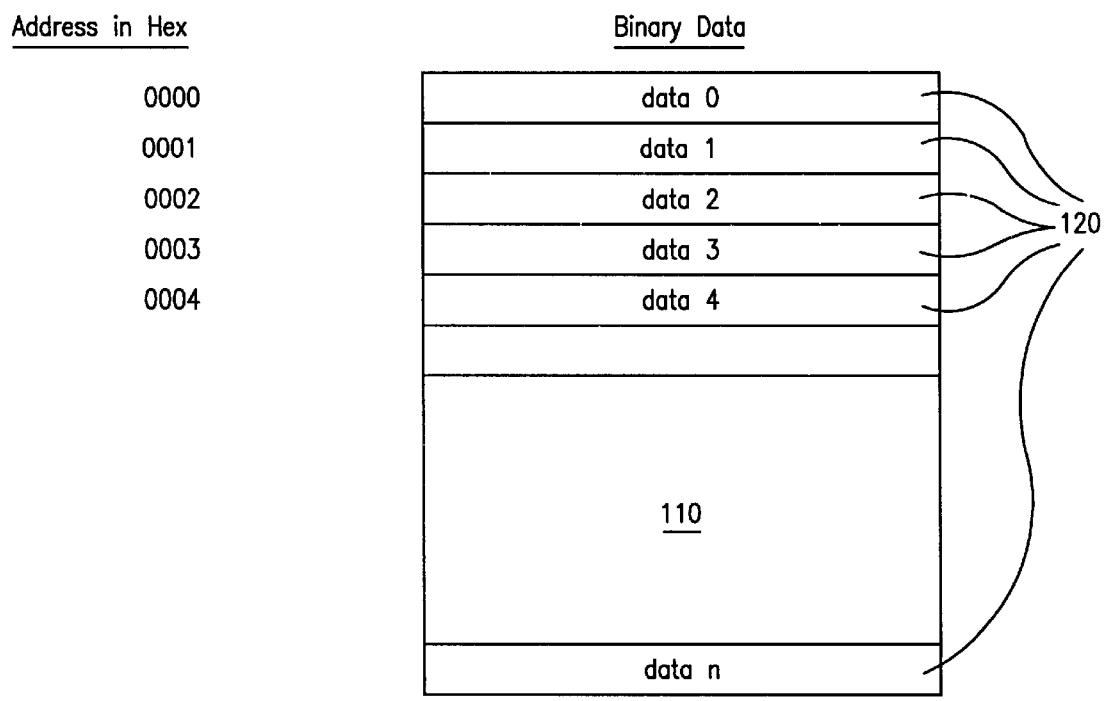

Turning to FIGS. 3A and 3B, there is shown an exemplary test set-up, for implementing the above detailed testing sequence. This testing sequence is typically in blocks as detailed above, that can be, at minimum, at least two cycles if there is a shifted bit between the respective first words of two consecutive cycles, or three cycles if the first word of the first cycle is an all "zeros" word, each cycle defined by one complement pair, from the binary block 20, detailed above. The blocks are written into and read from a memory component. With at least one block written into the memory component, the at least one block is then read from the memory component, typically in a FIFO order.

The set up includes a computer 100, typically a PC or the like, having a CPU 102, for example, an Intel® Pentium® or similar, and a PC memory 104 or other data storage unit or device, that here, for example can function as a reading or data buffer. The computer 100 connects via a bus 106 to various circuit boards (BOARD 1 to BOARD N) 108a–108n. Each board 108a–108n includes various memory components 110, for example FIFO and SDRAM components associated therewith. Within each memory component 110, is a storage area for binary data (data 0 to data n) 120 with its corresponding address in Hex, in which the binary data, in accordance with the testing sequence above, will be written into and subsequently read therefrom (as detailed below).

Figure 4:
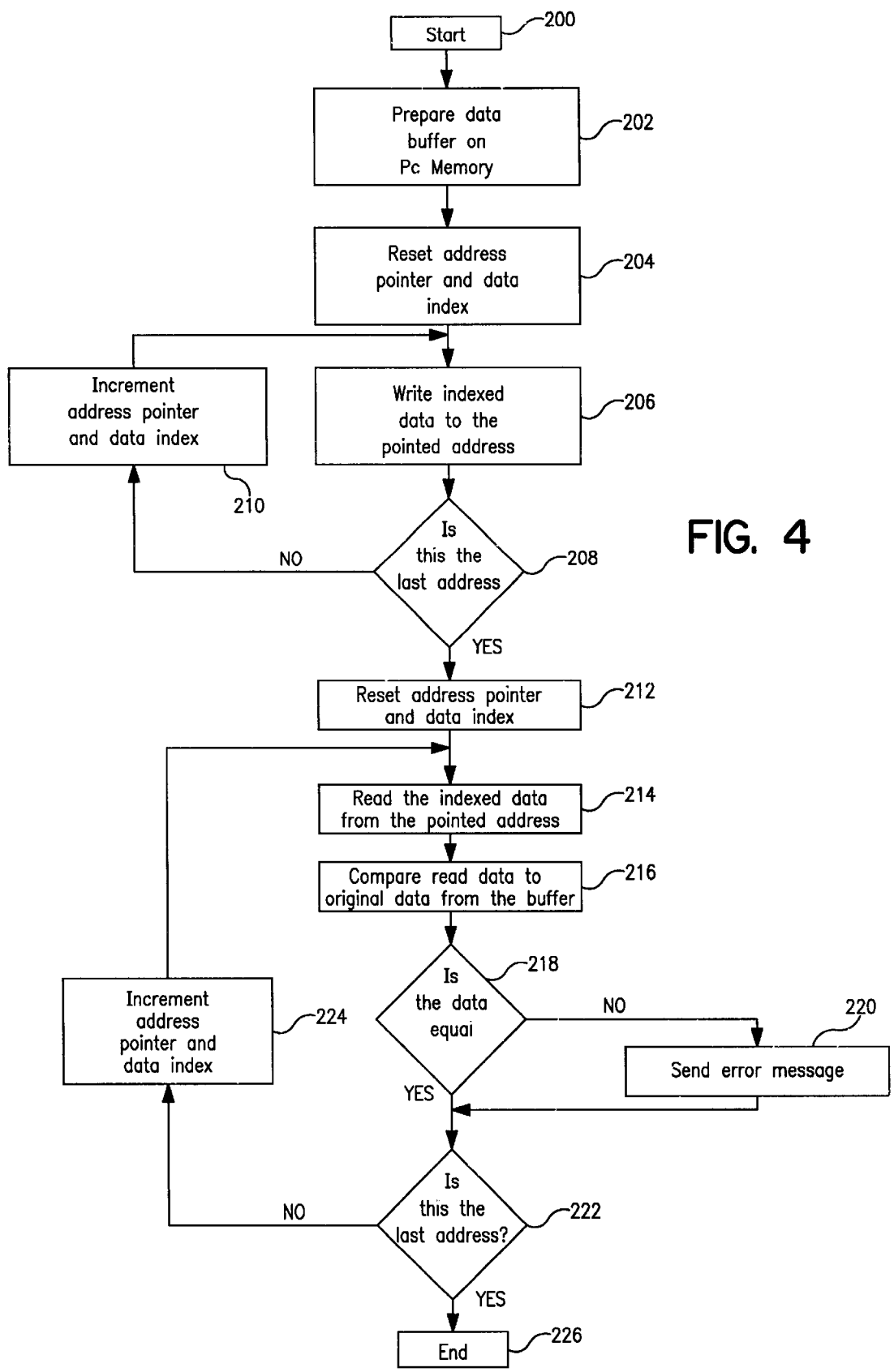
FIG. 4 is a flow diagram of an exemplary testing method in accordance with an embodiment of the present invention.

Turning to FIG. 4, there is shown an exemplary testing process for memory components in a flow diagram. The testing process starts at step 200, as the data buffer of the PC memory 104 is prepared, at step 202. If necessary, preparation of the PC memory 104 begins as Hex words, corresponding to the above detailed testing sequence, are entered into the computer 100. These Hex words are entered in accordance with the testing sequence desired and in accordance with the memory components to be tested. These Hex words are translated into binary by the computer CPU 102, and loaded into the PC memory 104.

The address pointer on the memory components 110 and the data index on the PC memory 104 are reset, at step 204, so as to be coordinated. The data, previously indexed in blocks of two or more cycles, in accordance with the desired testing sequence, is written into the pointed address in the instant memory component, in accordance with the requisite two or more cycles, at step 206. This process continues until the last pointed address of the requisite memory component has been filled with indexed data, step 208, by incrementing the access pointer and data index, both typically by "1", at step 210 and writing data, in the corresponding one or more cycles, into the pointed address (step 206).

With the writing process now complete, both the address pointer in the memory component and the data index in the PC memory 104 are reset at step 212. The indexed data is read, in accordance with the two or more cycles from which it was written, from the respective pointed address in the computer 100, at step 214. The read data is compared to the corresponding originally written indexed data (in cycles) in the data buffer (PC Memory 104), at step 216, by a comparitor, typically software, but could also be hardware, or combinations of hardware and software, within the computer 100. The comparitor (software) analyzes the data for equivalence at step 218.

If the received data is not equivalent, an error message is generated and sent to the user at step 220, typically at the user interface. This error message is indicative of a fault in the memory component under test and can be such that the specific defective bit is indicated. If the data is equivalent, the process continues until the last address is reached, at step 222. If the last pointed address has not been reached, the address pointer and data index are incremented, both typically by "1", at step 224, and the process continues from step 214 until the last pointed address and corresponding data index have been reached (step 222). If the last pointed address of the memory component has been reached, the process ends at step 226.

This procedure can be repeated for as long as desired, by returning to the start step 200. In this way, the requisite number of memory components or portions thereof can be tested.

For all of the procedures detailed above the binary block 20 may have to be inputted to the computer 100 in hex or any other base system, depending on the computer and the programs used therein. The computer or device coupled thereto, should be able to convert the hex or other base system to binary, for writing into the memory component(s) as detailed above.

An Example of a test in accordance with an embodiment of the present invention was performed. Here, a FIFO memory component, an OKI/MSM 542222 component having 512 Kbytes words, on a standard board was configured in accordance with the test set up shown and described for FIGS. 3A and 3B above. The testing sequence, according to the present invention was written into the memory component and read therefrom in accordance with the program code provided below.

The methods and apparatus detailed above, have been described without reference to specific hardware or software. Rather, the methods and apparatus have been described in a manner sufficient to enable persons of ordinary skill in the art to readily adapt commercially available hardware and software as may be needed to reduce any of the above detailed embodiments to practice without undue experimentation using conventional techniques.

It will further be appreciated by persons skilled in the art that the methods described above may be implemented by software, software means (data), or other computer-usable storage medium, including for example, magnetic, optical or semiconductor storage, or other source of electronic signals, executable on computing means, such as a CPU, PC, or other similar data processors, microprocessor, embedded processors, microcomputers, microcontrollers, etc. The computing means processes the inputted data from apparatus in communication therewith to calculate a desired result. Processing includes performing operations, typically in the form of algorithms, programs or the like, for performing the above detailed methods of the present invention.

While preferred embodiments of the present invention have been described, so as to enable one of skill in the art to practice the present invention, the preceding description is intended to be exemplary only. It should not be used to limit the scope of the invention, which should be determined by reference to the following claims.

Program Code

```
*----------------------------------------------------------------
------------*/
// status definitions
#define TEST_PASS           0
#define TEST_FAIL           1
*define BOARD_MEM_ADRS     0x1234   // address of the tested memory on board
#define TESTED_BLOCK_SIZE   1024    // number of "longs" in the buffer
```

-continued

Program Code

```
// funcions prototype
int CheckMem (void) ;
void FillBuffer    (unsigned long *, unsigned long );
void WriteBuffer   (unsigned long , unsigned long *, unsigned long );
void ReadBuffer    (unsigned long , unsigned long *, unsigned long );
// ############################################################

void main (void)
(
    int status = CheckMem();
)
// ############################################################

int CheckMem (void)
(
    unsigned long index;
    unsigned long SentBuff(TESTED_BLOCK_SIZE);
    unsigned long RecvBuff(TESTED_BLOCK_SIZE);
                   men. cpp
    FillBuffer (SentBuff, TESTED_BLOCK_SIZE);
    WriteBuffer(BOARD_MEM_ADRS, SentBuff,
    TESTED_BLOCK_SIZE);
    ReadBuffer (BOARD_MEM_ADRS, RecvBuff,
    TESTED_BLOCK_SIZE);
    // compare the two buffers and report if any error . . .
    for (index = 0; index < TESTED_BLOCK_SIZE; index ++)
        (
        if (SentBuff[index] != RecvBuff[index])
            return TEST_FAIL;
        )
    return TEST_PASS;
)
// ############################################################

void FillBuffer (unsigned long *Buff, unsigned long BuffSize)
( // filling the buffer with the tested content
    unsigned long index, RunningOneDW;
    for (index = 0; index < (BuffSize / 2); index++)
        RunningOneDW = 0x1 << (index % 32);
        Buff[2 * index] = RunningOneDw;
        Buff[2 * index + 1] = 0XFFFFFFFF - RunningOneDW;
    )
)
// ############################################################

void WriteBuffer (unsigned long BrdMemAdrs, unsigned long
*PcBuffAdrs, unsigned long Buffsize)
(
    // this function supposed to write a buffer from pc's memory
    // to the board's memory in dma process or any other way
)
// ############################################################

void ReadBuffer (unsigned long BrdMemAdrs, unsigned long
*PcBuffAdrs, unsigned long BuffSize)
    // this function supposed to read a buffer from board's memo
ry
    // to the pc's memory in dma process or any other way
)
// ############################################################
```

What is claimed is:

1. A method for testing memory components comprising:

providing a testing sequence comprising at least a first cycle and at least one subsequent cycle, each of said first and said at least one subsequent cycle including a first word of N bits and a second word of N bits, said second word defined as the complement of said first word, and said at least one subsequent cycle including a first word including only one bit shifted with respect to said corresponding bit in said first word of said previous cycle, said shifted bit being shifted in the direction from least significant bit to most significant bit;

writing said testing sequence into at least one memory component; and reading said testing sequence from said at least one memory component.

2. The method of claim 1, additionally comprising:

comparing said words of said testing sequence written into said memory component with said words corresponding to said testing sequence read from said memory component.

3. The method of claim 2, additionally comprising:

sending an error message if said compared words are not equivalent.

4. The method of claim 1, wherein said providing said testing sequence includes:

providing the first word of said first cycle with N bits of the binary 0.

5. The method of claim 4, wherein said at least one subsequent cycle includes N subsequent cycles and said shifted bit in the first word of each subsequent cycle is defined as the least significant bit that was unshifted in the first word of the previous cycle, said shifted bit in each subsequent cycle shifted in the direction from least significant bit to most significant bit.

6. The method of claim 5, wherein each of said at least one shifted bits in each of said first words of each of said N subsequent cycles are positionally adjacent each other.

7. The method of claim 5, wherein said at least one subsequent cycle includes a plurality of subsequent cycles and said at least one shifted bit in said first word of each subsequent cycle continues until the most significant bit of said N bits of a first word of one of said subsequent cycles has been shifted.

8. A system for testing memory components comprising:

a data buffer; and a processor in communication with said data buffer, said processor programmed to:

provide a testing sequence comprising at least a first cycle and at least one subsequent cycle, each of said first and said at least one subsequent cycle including a first word of N bits and a second word of N bits, said second word defined as the complement of said first word, and said at least one subsequent cycle including a first word including only one bit shifted with respect to said corresponding bit in said first word of said previous cycle, said shifted bit being shifted in the direction from least significant bit to most significant bit;

write said testing sequence into at least one memory component; and read said testing sequence from said at least one memory component.

9. The system of claim 8, wherein said processor is additionally programmed to:

compare said words of said testing sequence written into said memory component with said words corresponding to said testing sequence read from said memory component.

10. The system of claim 9, additionally comprising:

generating an error message if said compared words are not equivalent.

11. The system of claim 8, wherein said processor is additionally programmed to:

provide said testing sequence with a first word of the first cycle with N bits of the binary 0.

12. The system of claim 11, wherein said processor is additionally programmed to:
provide said at least one subsequent cycle to include N subsequent cycles and said shifted bit in the first word of each subsequent cycle is defined as the least significant bit that was unshifted in the first word of the previous cycle, said shifted bit in each subsequent cycle shifted in the direction from least significant bit to most significant bit.

13. A computer-usable storage medium having a computer program embedded thereon for causing a suitably programmed system to test memory components by performing the following steps when such program is executed on the system, said steps comprising:
providing a testing sequence comprising at least a first cycle and at least one subsequent cycle, each of said first and said at least one subsequent cycle including a first word of N bits and a second word of N bits, said second word defined as the complement of said first word, and
said at least one subsequent cycle including a first word including only one bit shifted with respect to said corresponding bit in said first word of said previous cycle, said shifted bit being shifted in the direction from least significant bit to most significant bit;
writing said testing sequence into at least one memory component; and
reading said testing sequence from said at least one memory component.

14. The computer usable storage medium of claim 13, for performing the following steps additionally comprising:
comparing said words of said testing sequence written into said memory component with said words corresponding to said testing sequence read from said memory component.

15. A method for testing memory components comprising:
preparing a data buffer by steps including:
providing at least one testing sequence comprising at least a first cycle and at least one subsequent cycle, each of said first and said at least one subsequent cycle including a first word of N bits and a second word of N bits, said second word defined as the complement of said first word, and
said at least one subsequent cycle including a first word including only one bit shifted with respect to said corresponding bit in said first word of said previous cycle, said shifted bit being shifted in the direction from least significant bit to most significant bit;
setting an address pointer to a first address;
writing said at least one testing sequence into said first address;
determining whether a predetermined number of addresses have been filled;
resetting said address pointer;
reading data corresponding to said testing sequence from said first address; and
determining whether a predetermined number of addresses have been read.

16. The method of claim 15, additionally comprising:
comparing said read data with data corresponding to said at least one testing sequence.

17. The method of claim 16, additionally comprising:
generating at least one error message if said compared data is not equivalent.

18. The method of claim 15, additionally comprising:
after said step of determining whether a predetermined number of addresses have been filled;
incrementing said address pointer to a subsequent address;
writing said at least one testing sequence into said subsequent address; and
determining whether a predetermined number of addresses have been filled.

19. The method of claim 18, wherein said step of incrementing said address pointer is in increments of the integer 1.

20. The method of claim 15, additionally comprising:
after said step of determining whether a predetermined number of addresses have been read;
incrementing said address pointer to at least one subsequent address;
reading data corresponding to said testing sequence from said subsequent address; and
determining whether a predetermined number of addresses have been read.

21. The method of claim 20, wherein said step of incrementing said address pointer is in increments of the integer 1.

22. A method for testing a memory component, the method comprising:
writing a first test cycle to the memory component, the first test cycle including a first word and its complement;
writing at least one additional test cycle to the memory component, the at least one additional test cycle including a first word and its complement, wherein the first word of the additional test cycle differs from the first word of the first test cycle by the value of two bits; and
reading the first and at least one additional test cycles from the memory component.

23. The method of claim 22, wherein the first test cycle is preceded by a cycle containing a word of all zeros and its complement.

24. The method of claim 22, wherein writing the first test cycle and writing the at least one additional test cycle each include writing a word with a single bit with a logical one value and a word with a single bit with a logical zero value.

25. A method for testing memory components comprising:
providing a testing sequence comprising at least a first cycle and at least one subsequent cycle, each of said first and said at least one subsequent cycle including a first word of N bits and a second word of N bits, said second word defined as the complement of said first word, and
said at least one subsequent cycle including a first word including at least one bit shifted with respect to said corresponding bit in said first word of said previous cycle, said shifted bit being shifted in the direction from least significant bit to most significant bit;
writing said testing sequence into at least one memory component;
reading said testing sequence from said at least one memory component;
wherein said providing said testing sequence includes providing the first word of said first cycle with N bits of the binary 0; and
wherein said at least one subsequent cycle includes N subsequent cycles and said shifted bit in the first word of each subsequent cycle is defined as the least significant bit that was unshifted in the first word of the previous cycle, said shifted bit in each subsequent cycle shifted in the direction from least significant bit to most significant bit.

26. The method of claim 25, wherein each of said at least one shifted bits in each of said first words of each of said N subsequent cycles are positionally adjacent each other.

27. The method of claim 25, wherein said at least one subsequent cycle includes a plurality of subsequent cycles and said at least one shifted bit in said first word of each subsequent cycle continues until the most significant bit of said N bits of a first word of one of said subsequent cycles has been shifted.

28. A system for testing memory components comprising:
   a data buffer; and
   a processor in communication with said data buffer, said processor programmed to:
      provide a testing sequence comprising at least a first cycle and at least one subsequent cycle, each of said first and said at least one subsequent cycle including a first word of N bits and a second word of N bits,
      said second word defined as the complement of said first word, and
      said at least one subsequent cycle including a first word including at least one bit shifted with respect to said corresponding bit in said first word of said previous cycle, said shifted bit being shifted in the direction from least significant bit to most significant bit;
      write said testing sequence into at least one memory component;
      read said testing sequence from said at least one memory component and
   wherein said processor is additionally programmed to:
      provide said testing sequence with a first word of the first cycle with N bits of the binary 0; and
      provide said at least one subsequent cycle to include N subsequent cycles and said shifted bit in the first word of each subsequent cycle is defined as the least significant bit that was unshifted in the first word of the previous cycle, said shifted bit in each subsequent cycle shifted in the direction from least significant bit to most significant bit.

* * * * *